United States Patent
Ling et al.

(10) Patent No.: US 6,914,189 B1
(45) Date of Patent: Jul. 5, 2005

(54) ELECTRONIC CARD WITH EDGE CONNECTOR TO MINIMIZE WEAR

(75) Inventors: Yun Ling, Portland, OR (US); Thai Dan Tong, Beaverton, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/789,844

(22) Filed: Feb. 27, 2004

(51) Int. Cl.[7] .............................................. H05K 5/00
(52) U.S. Cl. ..................... 174/52.1; 361/737; 361/756; 361/741
(58) Field of Search ........................ 174/52.1; 361/737, 361/752, 756, 741

(56) References Cited

U.S. PATENT DOCUMENTS

| | | | | |
|---|---|---|---|---|
| 5,973,925 A | * | 10/1999 | Kraemer | 361/737 |
| 5,986,891 A | * | 11/1999 | Sugimoto | 361/737 |
| 6,077,088 A | * | 6/2000 | Yu et al. | 439/64 |
| 6,116,962 A | * | 9/2000 | Laity | 439/676 |
| 6,121,544 A | * | 9/2000 | Petsinger | 174/35 R |
| 6,124,716 A | * | 9/2000 | Kanamori | 324/538 |
| 6,166,913 A | * | 12/2000 | Fun et al. | 361/737 |
| 6,542,358 B1 | * | 4/2003 | Kunz et al. | 361/686 |
| 6,574,112 B2 | * | 6/2003 | Washino et al. | 361/752 |
| 6,594,154 B1 | * | 7/2003 | Brewer et al. | 361/801 |
| 6,783,076 B2 | * | 8/2004 | Kondo et al. | 235/492 |

* cited by examiner

Primary Examiner—Hung V. Ngo
(74) Attorney, Agent, or Firm—Buckley, Maschoff & Talwalkar LLC

(57) ABSTRACT

An auxiliary electronic card includes a card base member formed of a first material. The card base member has at least one electronic device mounted on the card base member. The card base member has a plurality of electrical edge contacts formed along an edge of a top surface of the card base member. The electrical edge contacts define a horizontal plane with respective upper surfaces of the electrical edge contacts. The electronic card also includes an edge shield member mounted at a vertical surface of the card base member at the edge of the card base member along which the contacts are formed. The edge shield member has a substantially horizontal upward-facing surface at an elevation that is no lower than the horizontal plane defined by the upper surfaces of the electrical edge contacts. The edge shield member is formed of a second material that has a coefficient of friction that is lower than a coefficient of friction of the first material.

16 Claims, 5 Drawing Sheets

ELECTRONIC CARD WITH EDGE CONNECTOR TO MINIMIZE WEAR

BACKGROUND

Plug-in cards for personal computers or other electronic devices are well known. Such cards may provide extra memory or a removable mass storage medium to the host device, among other functions.

One problem presented in designing such cards is the need to assure adequate durability for the card and host connector contacts in view of the numerous plug-in/removal cycles that a card and/or a host connection may experience over the life of the devices. Some standards for plug-in card systems call for a durability of at least 10,000 cycles.

Conventional plug-in cards may be formed from a card base material that may include a hard and rough material such as fiberglass. The presence of such a material at the edge of the card may produce rapid wear of the host contacts with which the card is mated, thereby compromising the desired durability of the card system.

DETAILED DESCRIPTION

Figure 1:
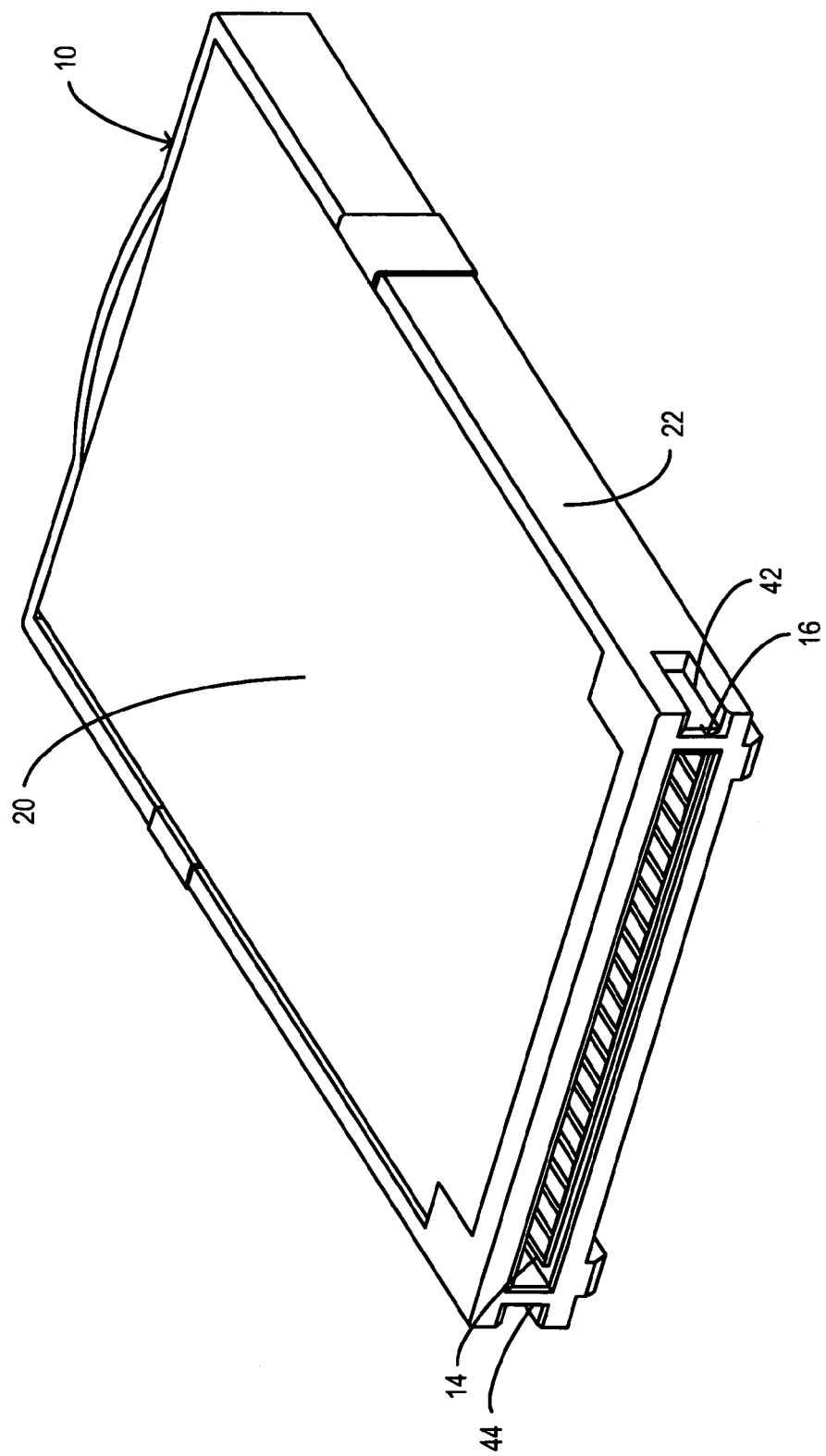
FIG. 1 is an isometric view of an auxiliary electronic card according to some embodiments.
Figure 2:
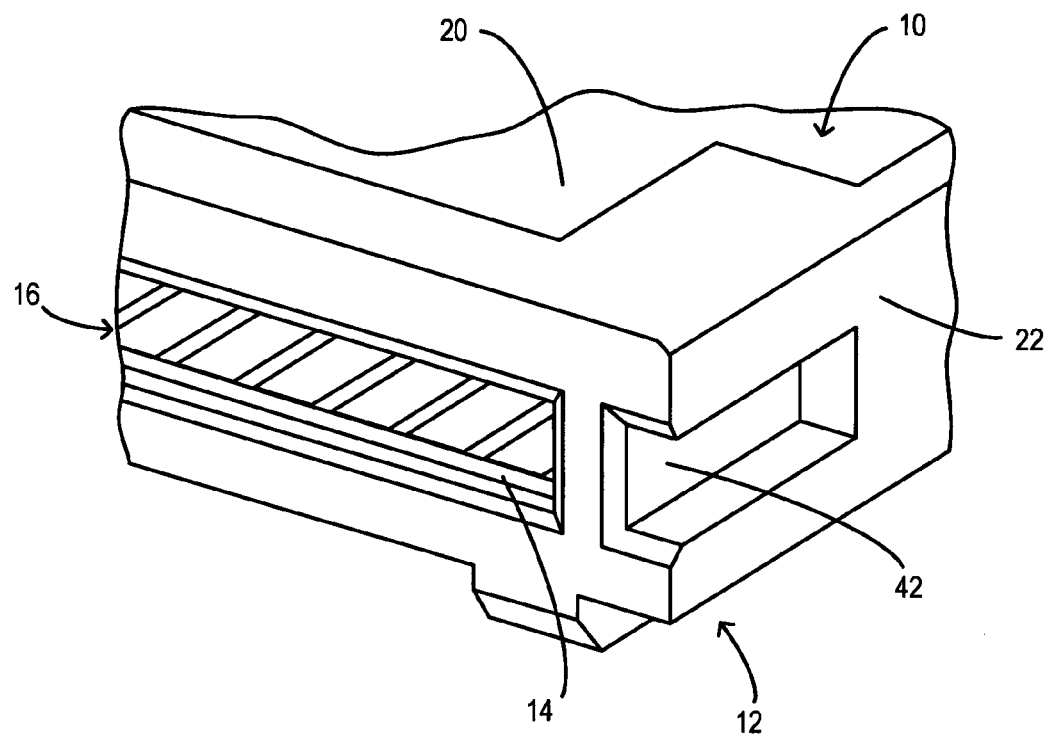
FIG. 2 is an isometric view showing some details of a front corner of the electronic card of FIG. 1.

FIG. 1 is an isometric view of an auxiliary plug-in electronic card 10 according to some embodiments. Some details of the electronic card 10 may be more readily seen from FIG. 2, which shows a front corner 12 of the electronic card 10. The electronic card 10 includes a card base member 14 which has a row of electrical edge contacts 16 arrayed along a front edge 18 (FIG. 3) of the upper surface of the card base member 14. The contacts 16 may be formed of an electrically conductive material such as copper.

Figure 4:
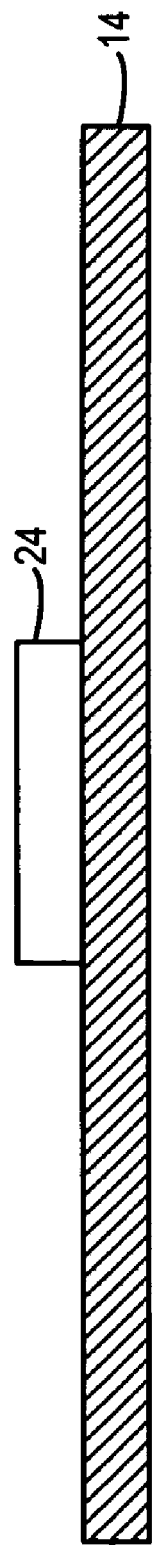
FIG. 4 is a schematic side view showing in isolation a card base member of the electronic card of FIG. 1 with an electronic device mounted thereon.

An enclosure is formed, in part, from the card base member 14, a top wall 20 and side walls (of which only one side wall 22 is visible in FIGS. 1 and 2) to protect electronic components (e.g., component 24, FIG. 4) mounted on the card base member 14. The electronic components may include, for example, a memory device such as flash memory, a mass storage device such as a hard disk drive, etc.

A card frame 26 (FIG. 3) at the front of the electronic card 10 forms a cavity 28 above the edge contacts 16. The card frame 26 includes an edge shield member 30 mounted at a vertical surface 32 of the card base member 14 at the front edge 18 of the card base member 14. The edge shield member 30 has a substantially horizontal upward-facing surface 34 that is at an elevation that is no lower than a horizontal plane defined by upper surfaces 36 of the edge contacts 16. In some embodiments the upper surfaces of the edge contacts 16 may be recessed slightly below the horizontal upward-facing surface 34 of the edge shield member 30.

In some embodiments, the edge shield member 30 has a chamfer 38 in the form of an inclined surface that is inclined downwardly and away (forwardly) from an outer edge 40 of the horizontal upward-facing surface 34 of the edge shield member 30.

The card frame 26 includes a first side vertical wall 42 (FIGS. 1 and 2), which extends parallel to a fore-and-aft direction of the electronic card 10, and a second side vertical wall 44 (FIG. 1) that is opposed to and parallel to the first side vertical wall 42. The card frame 26 also includes a top wall 46 (FIG. 3) that extends horizontally above the edge shield member 30 and extends between the first side vertical wall 42 and the second side vertical wall 44. The card frame 26 also includes a third vertical wall 48 that forms a rear wall of the cavity 28 and serves to close the enclosure in which the electronic device or devices of the electronic card 10 are contained. The third vertical wall 48 is located inwardly from the edge shield member 30 and extends perpendicular to the first and second side vertical walls 42, 44. It will be appreciated that the third vertical wall 48 may close the space between the first and second vertical walls 42, 44.

In some embodiments, the card frame 26, including the edge shield member 30, the vertical walls 42, 44, 48 and the top wall 46, may be formed of a single molded piece. The card frame 26, including the edge shield member 30, may be formed of a relatively low friction material such as silicone-filled ABS (Acrylonitrile-Butadiene-Styrene) or PTFE (polytetrafluoroethylene)-filled nylon. Other low friction materials may alternatively be employed for the edge shield member 30. The card base member 14 may be formed of a different material, including for example a fiberglass weave, and a material of which the edge shield member 30 is formed may have a lower coefficient of friction than a material of which the card base member 14 is formed.

Figure 3:
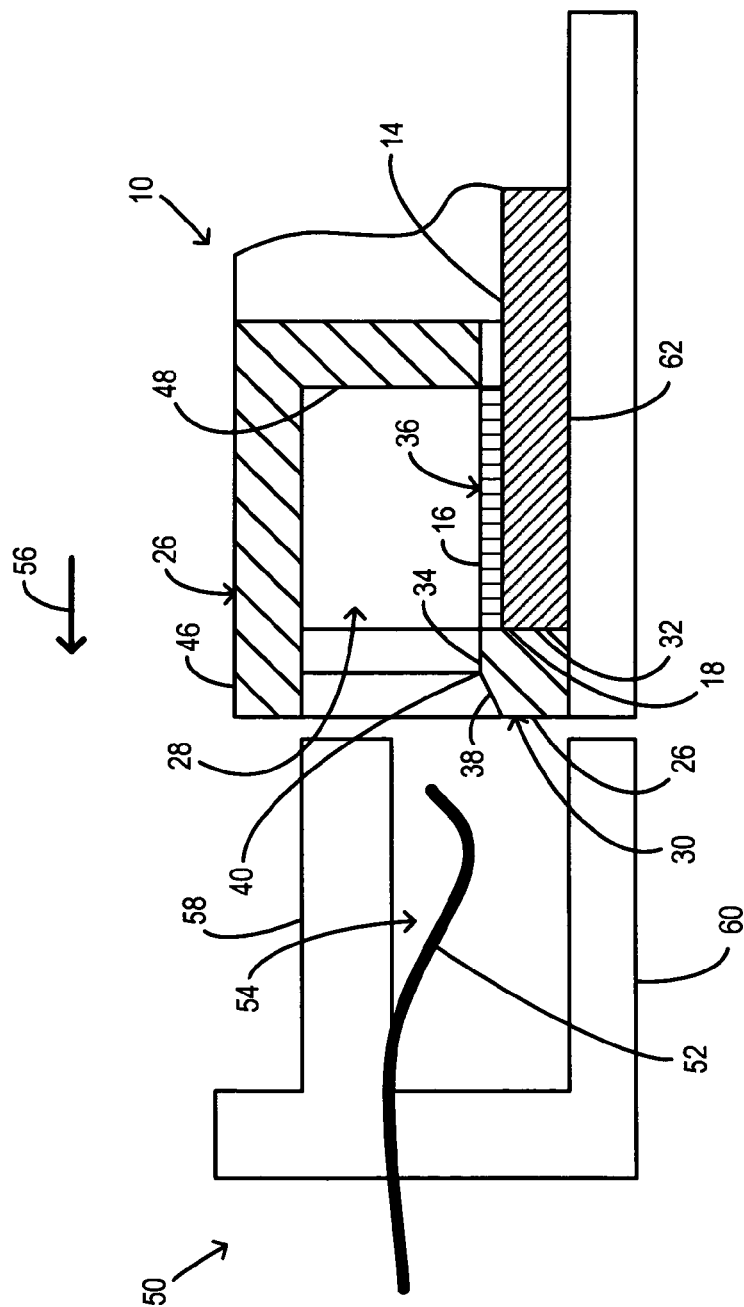
FIG. 3 is a somewhat schematic, partial side sectional view showing a connector portion of the electronic card of FIG. 1 in juxtaposition with a connector portion of a host electronic device.

Aside from the connector arrangement illustrated in FIG. 3, the electronic card 10 may generally be configured in accordance with a standard for plug-in card modules, such as, for example, the "ExpressCard" standard promulgated by PCMCIA (Personal Computer Memory Card International Association), 2635 North First Street, Suite 209, San Jose, Calif. 95134.

FIG. 3 shows the front (connecting) portion of the electronic card 10 in juxtaposition with the connecting portion of a host electronic device 50. The host device 50 includes a contact beam 52 within a housing 54 that is open at one end. (In practice, the housing 54 contains one contact beam 52 for each of the edge contacts 16 of the electronic card 10, although only one beam 52 is visible in the drawing.) The beam 52 extends towards the open end of the housing 54.

When the connecting portion of the electronic card 10 is plugged into the connecting portion of the host device 50, as indicated by arrow 56, the contact beam 52 comes into contact with the chamfer 38 of the edge shield member 30 and slides upwardly on the chamfer 38 to come to rest in contact with the upper surface 36 of the edge contact 16 of the electronic card 10. The upper wall 58 of the housing 54 of the host device 50 comes into abutment with the vertical wall 48 of the card frame 26 to limit the forward motion of the electronic card 10 relative to the host device 50. The lower wall 60 of the housing 54 is accommodated by a recess 62 below the edge shield member 30 and the card base member 14 of the electronic card 10.

Because the contact beam 52 initially is contacted with the low-friction edge shield member upon insertion of the card 10 into the host device 50, wear of the contact beam 52 may be minimized, allowing the card system contacts to exhibit a high degree of durability. It is further advantageous in terms of reducing contact wear that a chamfer is provided on the edge shield member to allow for a gentler angle of incidence of the contact beam on the edge shield. Furthermore, the edge of the card base member is covered by the edge shield, so that the sharp and potentially rough edge of the card base member does not come into contact with the contact beam to cause wear of the contact beam.

The contact arrangement for the electronic card shown herein is further advantageous in that no separate connector need be provided on the card base member, thereby reducing manufacturing and assembly cost and also reducing the electrical length of the mated connector, so that the electrical performance of the connection between host device and card may be improved.

In addition, the rear wall 48 of the card frame 26 may serve to seal the enclosure of the card within which the electronic device or devices are contained, thereby protecting the electronic device or devices from dust, foreign objects, etc.

Figure 5:
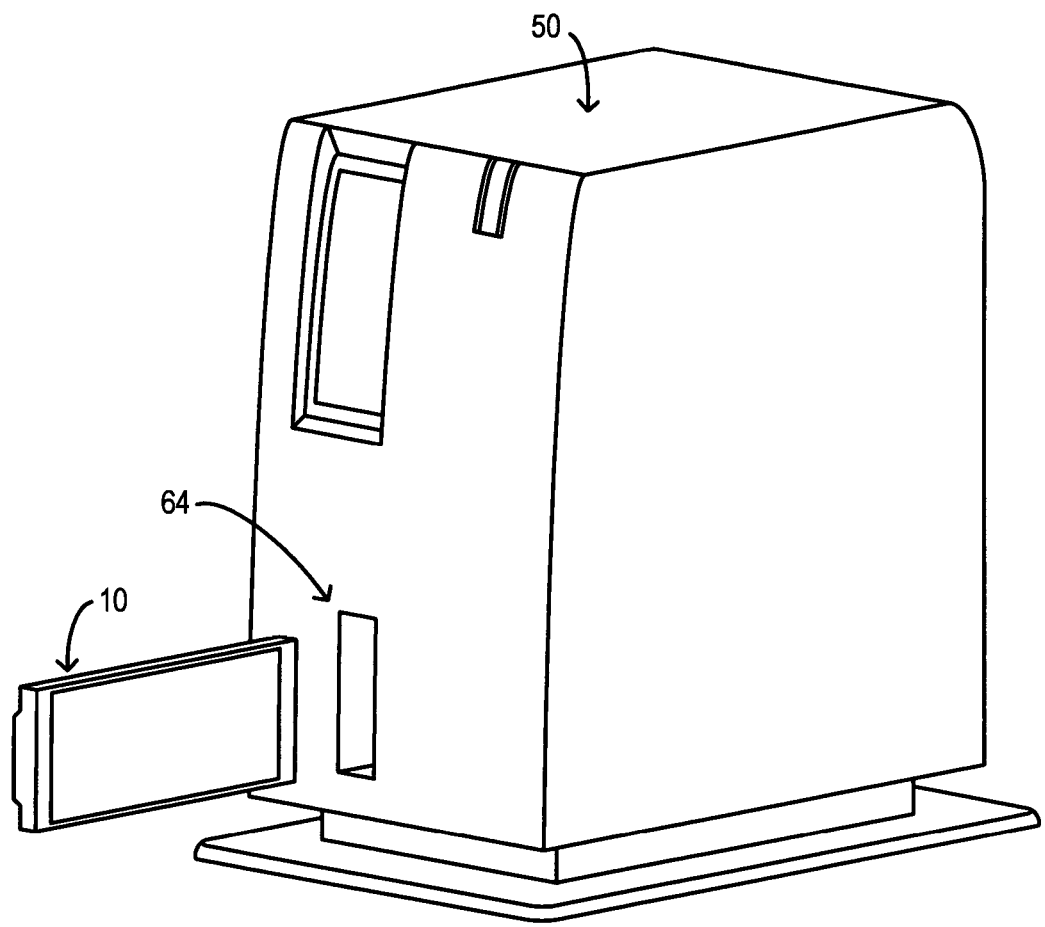
FIG. 5 is a perspective view showing the electronic card of FIG. 1 in juxtaposition with a receptacle of a tower component of a personal computer.

FIG. 5 shows an embodiment in which the host device 50 takes the form of a tower component of a personal computer. It will be observed that the electronic card 10 is shown in juxtaposition with a receptacle 64 of the host device 50 which allows the card 10 to be plugged in to the host device 50. The card 10 may also be used with other types of host devices, such as laptop computers, PDAs, digital cameras, etc.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. An auxiliary electronic card, comprising
   a card base member formed of a first material, the card base member having at least one electronic device mounted thereon, the card base member having a plurality of electrical edge contacts formed along an edge of a top surface of the card base member, the electrical edge contacts defining a horizontal plane with respective upper surfaces of the electrical edge contacts; and
   an edge shield member mounted at a vertical surface of the card base member at said edge of the card base member, the edge shield member having a substantially horizontal upward-facing surface at an elevation that is no lower than the horizontal plane defined by the upper surfaces of the electrical edge contacts, the edge shield member being formed of a second material that has a coefficient of friction that is lower than a coefficient of friction of the first material.

2. The electronic card of claim 1, wherein the edge shield member has an inclined surface that is inclined downwardly and away from an outer edge of said substantially horizontal upward-facing surface of said edge shield member.

3. The electronic card of claim 1, wherein the second material includes at least one of silicone-filled ABS and PTFE-filled nylon.

4. The electronic card of claim 1, wherein the edge shield member is part of a card frame which includes a first vertical wall, a second vertical wall extending parallel to the first vertical wall and a top wall extending horizontally above the edge shield member and extending between the first and second vertical walls.

5. The electronic card of claim 4, wherein the card frame includes a third vertical wall located inwardly from the edge shield member and extending perpendicular to the first and second vertical walls.

6. A connector comprising:
   a plurality of electrical edge contacts disposed along an edge of a substrate, the electrical edge contacts having upper surfaces that define a horizontal plane; and
   a frame member which defines a space above the edge contacts, the frame member including an edge shield member positioned at said edge of the substrate and having a substantially horizontal upward-facing surface at an elevation that is no lower than the horizontal plane defined by the upper surfaces of the electrical edge contacts.

7. The connector of claim 6, wherein the edge shield member has an inclined surface that is inclined downwardly and away from an outer edge of said substantially horizontal upward-facing surface of said edge shield member.

8. The connector of claim 6, wherein the frame member includes at least one of silicone-filled ABS and PTFE-filled nylon.

9. The connector of claim 6, wherein the frame member includes a first vertical wall, a second vertical wall extending parallel to the first vertical wall and a top wall extending horizontally above the edge shield member and extending between the first and second vertical walls.

10. The connector of claim 9, wherein the frame member includes a third vertical wall located inwardly from the edge shield member and extending perpendicular to the first and second vertical walls.

11. A system comprising:
    a host electronic device which includes a receptacle that has at least one contact beam; and
    an auxiliary card received in the receptacle, the auxiliary card including:
       a card base member formed of a first material, the card base member having at least one electrical edge contact formed thereon, the at least one electrical edge contact being in contact with said at least one contact beam of the host electronic device, the at least one electrical edge contact having at least one upper surface to define a horizontal plane; and
       an edge shield member mounted at a vertical surface of the card base member adjacent said at least one electrical edge contact, the edge shield member having a substantially horizontal upward-facing surface at an elevation that is no lower than the horizontal plane defined by the at least one upper surface of the at least one electrical edge contact, the edge shield member being formed of a second material that has a coefficient of friction that is lower than a coefficient of friction of the first material.

12. The system of claim 11, wherein the edge shield member has an inclined surface that is inclined downwardly and away from an outer edge of said substantially horizontal upward-facing surface of said edge shield member.

13. The system of claim 11, wherein the edge shield member includes at least one of silicone-filled ABS and PTFE-filled nylon.

14. The system of claim 11, wherein the edge shield member is part of a card frame which includes a first vertical wall, a second vertical wall extending parallel to the first vertical wall and a top wall extending horizontally above the edge shield member and extending between the first and second vertical walls.

15. The system of claim 14, wherein the card frame includes a third vertical wall located inwardly from the edge shield member and extending perpendicular to the first and second vertical walls.

16. The system of claim 11, wherein the host electronic device is a personal computer.

* * * * *